(12) United States Patent
Chou

(10) Patent No.: US 6,946,360 B2
(45) Date of Patent: Sep. 20, 2005

(54) FLUID PRESSURE BONDING

(75) Inventor: Stephen Y. Chou, Princeton, NJ (US)

(73) Assignee: Nanonex Corporation, Princeton, NJ (US)

( * ) Notice: Subject to any disclaimer, the term of this patent is extended or adjusted under 35 U.S.C. 154(b) by 0 days.

(21) Appl. No.: 10/161,776

(22) Filed: Jun. 4, 2002

(65) Prior Publication Data

US 2002/0177319 A1 Nov. 28, 2002

Related U.S. Application Data

(63) Continuation-in-part of application No. 09/618,174, filed on Jul. 18, 2000, now Pat. No. 6,482,742.

(51) Int. Cl.[7] .......................... H01L 21/30; H01L 21/46; C03C 27/00; B65C 3/26
(52) U.S. Cl. .......................... 438/455; 438/456; 156/105; 156/156; 156/285
(58) Field of Search .................... 438/455–459; 156/105, 156, 244.19, 244.21, 285

(56) References Cited

U.S. PATENT DOCUMENTS

| | | | |
|---|---|---|---|
| 3,922,134 A | 11/1975 | Kupfrian | |
| 4,504,341 A * | 3/1985 | Radzwill et al. | 156/102 |
| 4,642,255 A * | 2/1987 | Dlubak | 428/38 |
| 4,747,896 A * | 5/1988 | Anastasie | 156/85 |
| 5,370,760 A | 12/1994 | Mori et al. | |
| 5,405,667 A * | 4/1995 | Heider | 428/36.5 |
| 5,427,599 A | 6/1995 | Greschner et al. | |
| 5,466,146 A | 11/1995 | Fritz et al. | |
| 5,643,522 A | 7/1997 | Park | |
| 5,648,109 A | 7/1997 | Gutowski et al. | |
| 5,863,452 A | 1/1999 | Harshberger, Jr. et al. | |
| 6,045,927 A * | 4/2000 | Nakanishi et al. | 428/614 |
| 6,121,103 A * | 9/2000 | Tully et al. | 438/381 |
| 6,245,161 B1 * | 6/2001 | Henley et al. | 148/33.4 |
| 6,319,745 B1 * | 11/2001 | Bertin et al. | 438/60 |
| 6,425,972 B1 * | 7/2002 | McReynolds | 156/285 |
| 6,444,160 B1 | 9/2002 | Bartoli | |
| 6,533,986 B1 | 3/2003 | Fosaaen et al. | |

* cited by examiner

Primary Examiner—Alexander Ghyka
(74) Attorney, Agent, or Firm—Polster, Lieder, Woodruff & Lucchesi, L.C.

(57) ABSTRACT

An improved method of bonding involves using direct fluid pressure to press together the layers to be bonded. Advantageously one or more of the layers are sufficiently flexible to provide wide area contact under the fluid pressure. Fluid pressing can be accomplished by sealing an assembly of layers to be bonded and disposing the assembly in a pressurized chamber. It can also be accomplished by subjecting the assembly to jets of pressurized fluid. The result of this fluid pressing is reduction of voids and enhanced uniformity over an enlarged area.

28 Claims, 4 Drawing Sheets

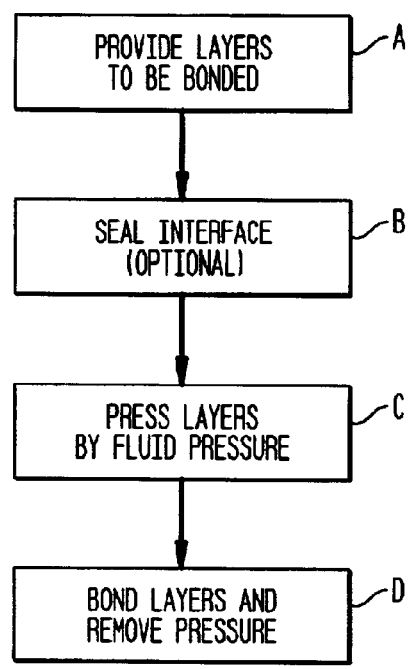
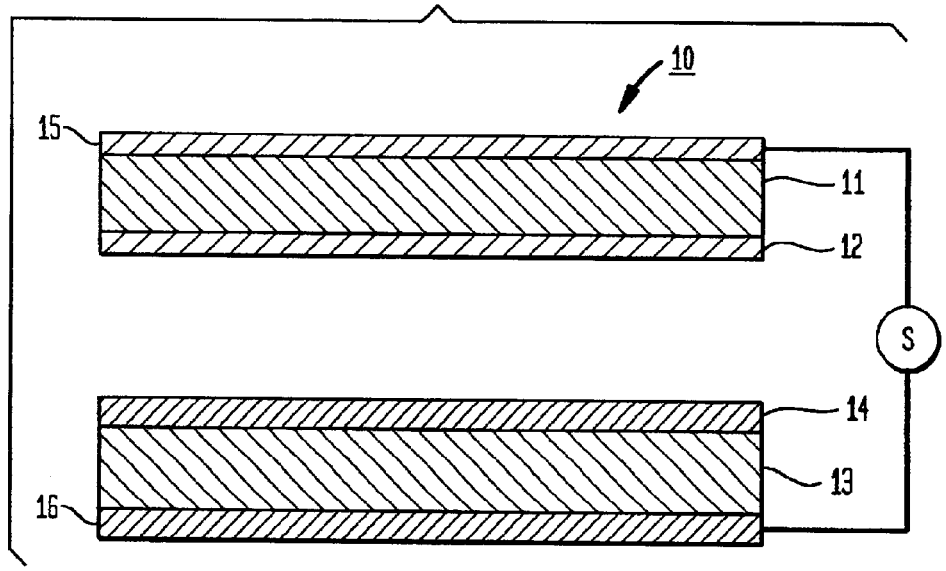

FLUID PRESSURE BONDING

CROSS REFERENCES TO RELATED APPLICATIONS

This application is a continuation-in-part of U.S. patent application Ser. No. 09/618,174 filed by Stephen Y. Chou on Jul. 18, 2000 now U.S. patent No. 6,482,742 and entitled "Fluid Pressure Imprint Lithography," which application is incorporated herein by reference.

FIELD OF THE INVENTION

This invention relates to bonding and, in particular, to bonding wherein direct fluid pressure is used to press together a plurality of layers to be bonded. The process is particularly useful to provide void free, uniform bonding over an increased area. The bonding can be by pressure alone or by the application of pressure and heat or electrical field.

BACKGROUND OF THE INVENTION

Bonding is an important process in the fabrication of many industrial, electronic, biological and optical devices. Typically bonding is accompanied by pressure together with heat, electrical field or both heat and field. A plurality of layers to be bonded are stacked in a loose assembly and pressed together. They are then subjected to heat and/or an electric field under pressure. The heat and/or field may effectuate the formation of chemical bonds as in ionic bonding.

The usual method of pressing the layers together is to stack the layers in an assembly and dispose the assembly on respective rigid plates of a mechanical press. This technique, however, has serious limitations in bonding layers of large area or imperfect planarity. Even high precision mechanical presses present tolerance problems over large areas. Presses move on guide shafts through apertures, and the spacings between the shafts and their respective apertures permit undesirable relative translational and rotational shifts between the assembly and the plates. Thus mechanical presses present serious alignment problems in high precision bonding. Moreover, despite the most careful construction, the layers to be bonded are not perfectly planar. When assemblies of these layers are disposed on the rigid plates of a press, the deviations from planarity over large areas can result in variations in the bonding pressure and spacing. Accordingly, it is desirable to provide a method of bonding which avoids the limitations of mechanical presses.

SUMMARY OF THE INVENTION

An improved method of bonding involves using direct fluid pressure to press together the layers to be bonded. Advantageously one or more of the layers are sufficiently flexible to provide wide area contact under the fluid pressure. Fluid pressing can be accomplished by sealing an assembly of layers to be bonded and disposing the assembly in a pressurized chamber. It can also be accomplished by subjecting the assembly to jets of pressurized fluid. The result of this fluid pressing is reduction of voids and enhanced uniformity over an enlarged area.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 1 is a schematic flow diagram of the steps in an improved method of bonding;

FIG. 2 illustrates a typical assemblies for use in the improved method of FIG. 1;

Figure 3:
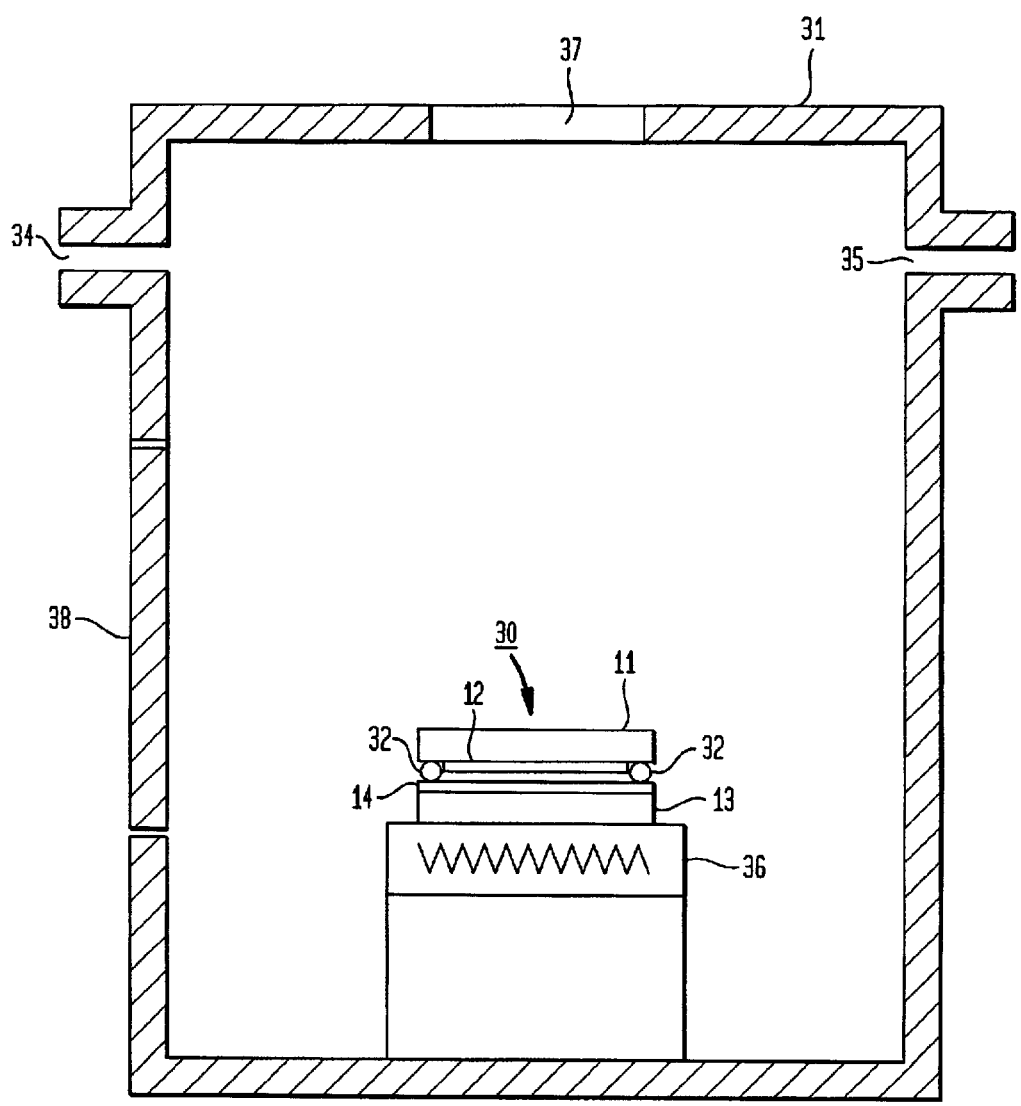
FIG. 3 illustrates apparatus for practicing the method of FIG. 1.

It is to be understood that these drawing are for purposes of illustrating the concepts of the invention and are not to scale.

DETAILED DESCRIPTION

In accordance with the invention, the problem of unwanted lateral movements of mechanical presses in bonding is ameliorated by using direct fluid pressure to press together the layers to be bonded. The inventive method applies fluid pressure over the assembly of layers to be bonded. Because the fluid pressure is isostatic, no significant unbalanced lateral forces are applied. Direct fluid pressure also includes fluid pressure transmitted to the assembly via a flexible membrane, as the membrane does not interfere with the transmission of isostatic pressure from the fluid. And streaming pressurized fluid from openings in a pressure vessel can also apply nearly isostatic direct fluid pressure on the plates or assembly.

It is contemplated that the invention will have important applications in the bonding of previously patterned layers. The layers can be aligned with respect to previous patterns using conventional alignment techniques, and be pressed by direct fluid pressure to minimize any relative lateral shifts. The consequence is improvement in the alignment of the patterns.

Referring to the drawings, FIG. 1 is a schematic flow diagram of an improved process for bonding using direct fluid pressure. An initial step shown in Block A, is to provide a plurality of layers to be bonded.

FIG. 2 illustrates a typical assembly 10 of layers 11, 13 to be bonded. The layer 11 is advantageously provided with an adherent coating 12 that will bond to layer 13 or to an adherent coating 14 on layer 13. For example, layers 11, 13 can be silicon wafers. Layer 11 can have an adherent coating 12 of aluminum and layer 13 can have an adherent outer surface 14 of silicon oxide. Under heat and pressure, adherent surface layers 12, 14 will adhere by metal-oxide bonding to bond layers 11, 13 together. In general, layers 11, 13 can be the same material or different materials. They can be plastic, glass, ceramic, or crystalline materials such as crystalline semiconductors.

Optionally, layers 11, 13 can be contacted by electrodes such as thin conductive layers 15 and 16, respectively, which can be disposed distally from the bonding interface. During the bonding step, the electrodes can be connected to a source S of voltage or current to facilitate bonding.

For highest uniformity and accuracy of placement, the layers to be bonded are advantageously made of the same material in order to minimize misalignment due to differential thermal expansion or contraction.

Preferably at least one of the layers 11, 13 is flexible so that, under the force of fluid pressure, the layers will conform despite deviations from planarity. Silicon substrates of thickness less than 2 mm exhibit such flexibility for typical pressures. Advantageously both layers are flexible.

The next step, shown in Block B, is to stack the layers together into an assembly to be bonded and to seal the interface between successive layers. If the layers include previously formed patterns to be bonded in registration, then the patterns should be carefully aligned in accordance with techniques well known in the art. The objective of the sealing is to permit external fluid pressure to press the layers together. The sealing can be effected in a variety of ways such as by providing a ring of fluid impermeable material, e.g. an elastomeric gasket, around the area to be bonded and peripherally clamping the assembly.

The third step (Block C) is to press the layers together by direct fluid pressure. One method for doing this is to dispose the assembly in a pressure vessel and to introduce pressurized fluid into the vessel. The advantage of fluid pressure is that it is isostatic. The resulting force uniformly pushes the layers together. Shear or rotational components are de minimus. Moreover if one or more of the layers is flexible rather than rigid, conformation between the layers is achieved regardless of unavoidable deviations from planarity. The result is an enhanced level of alignment and uniformity of spacing and bonding over an increased area of the film.

The pressurized fluid can be gas or liquid. Pressurized air is convenient and typical pressures are in the range 1–1000 psi. The fluid can be heated, if desired, to assist in effectuating bonding.

FIG. 3 illustrates a sealed assembly 30 disposed within a pressure vessel 31. The assembly 30 is sealed by a peripheral elastomeric gasket 32, extending around the area to be bonded. The periphery of the assembly can be lightly clamped by a clamp (not shown) to effectuate the seal. The vessel 31 preferably includes a valve-controlled inlet 34 for the introduction of pressurized fluid and a valve controlled outlet 35 for the exit of such fluid. The vessel 31 may optionally include a heater 36 for heating the layers and/or a transparent window 37 for introducing radiation to cure or cross link adhesives. A sealable door 38 can provide access to the interior of the vessel.

The next step shown in Block D, is to bond the layers of the assembly and to remove the bonded assembly from the pressure vessel. The precise process for bonding depends on the material of the layers. Many combinations of materials will bond with the application of pressure and heat. Others can bond under pressure by the application of an electric field or current between layers of the assembly. Yet others can be most easily bonded under pressure by applying both heat and an electric field or current. Heat can be applied in any one of a variety of known ways, including heating the pressurized fluid or applying infrared radiation. Voltage or current can be applied via a source S connected to electrodes 15, 16 as shown in FIG. 1. Voltages can range from 1 to 10,000 volts. Current densities can range from a nanoampere/cm$^2$ to 10 amps/cm$^2$. The source S can be AC or DC.

Alternatively, the layers can be bonded under pressure using adhesives. Radiation curable adhesives can be hardened under pressure by the application of UV radiation. Such radiation can be supplied through the window 37 of the pressure vessel. The layers can be made of transparent material to permit the radiation to reach the adhesive.

As mentioned above, there are a variety of ways of sealing the assembly of layers 30 so that pressurized fluid will press the layers together. FIGS. 4A–4D illustrate several of these ways.

Figure 4A:
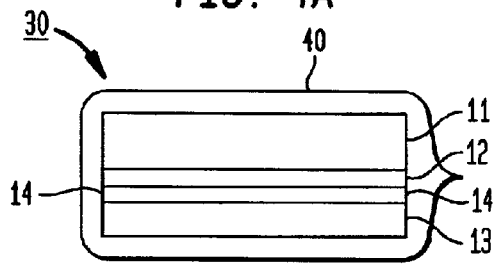
FIGS. 4A–4E illustrate alternative sealing arrangements useful in the method of FIG. 1.

FIG. 4A schematically illustrates an arrangement for sealing an assembly 30 by disposing the assembly within a sealed covering of flexible, fluid-impermable membrane 40 (e.g. a plastic bag). In this arrangement the regions between successive layers are sealed in relation to an external pressure vessel. Preferably the air is removed from the bag before applying pressure.

Figure 4B:
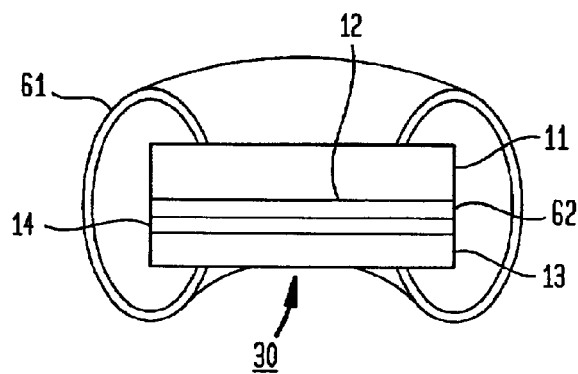

FIG. 4B shows an alternate sealing arrangement wherein the assembly 30 is sealed by a peripheral sealing clamp 61 which can be in the form of a hollow elastic torroid. Sealing can be assisted by providing one of the layers with a protruding region 62 extending around the region to be bonded. In use, the clamp and pressurized fluid will press the protruding region 62 into the layers, sealing the region to be bonded.

Figure 4C:
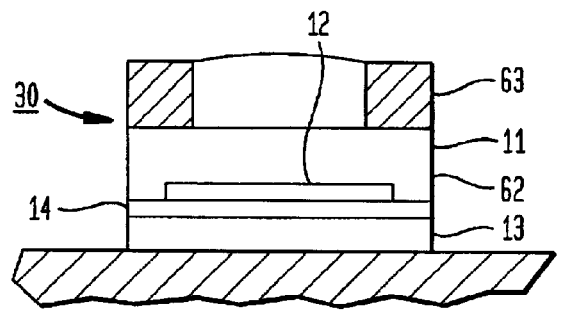

FIG. 4C illustrates a sealing arrangement in which the assembly 30 is sealed by applying a peripheral tube or weight 63 which lightly presses the periphery of the layers together. A peripheral protruding region 62 can assist sealing.

Figure 4D:
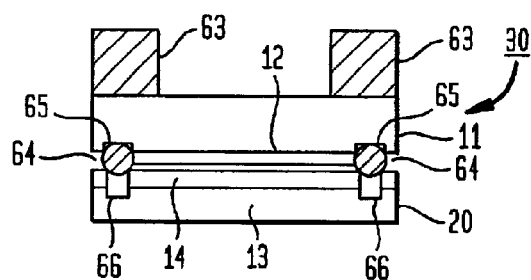

FIG. 4D shows an alternative sealing arrangement wherein the assembly 30 is sealed by a sealing O-ring 64 between successive layers. Preferably the O-ring seats within peripheral recesses 65, 66 in the layers. Light pressure from a peripheral tube or weight 63 can assist sealing.

Figure 4E:
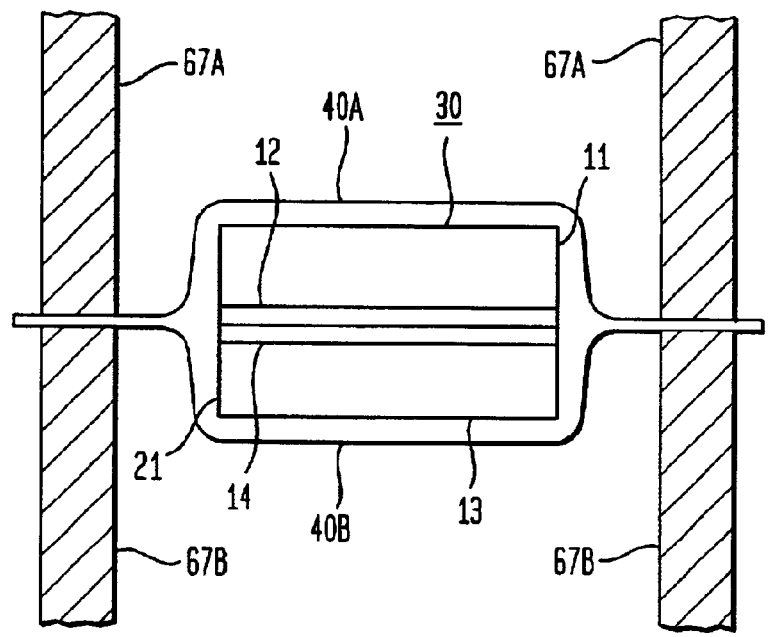

FIG. 4E shows yet another sealing arrangement in which the assembly 30 is disposed between a pair of flexible impermeable membranes 40A and 40B and is enclosed within a pair of mating cylinders 67A, 67B. The mating cylinders sealingly press together the membranes around the periphery of the assembly. Application of fluid pressure to the interior of the cylinders presses the layers together.

Alternatively, two the cylinders could lightly seal against the layers, before pressurization. Yet further in the alternative, the assembly could rest upon a planar support and a single cylinder lightly seal against the layers.

Figure 5:
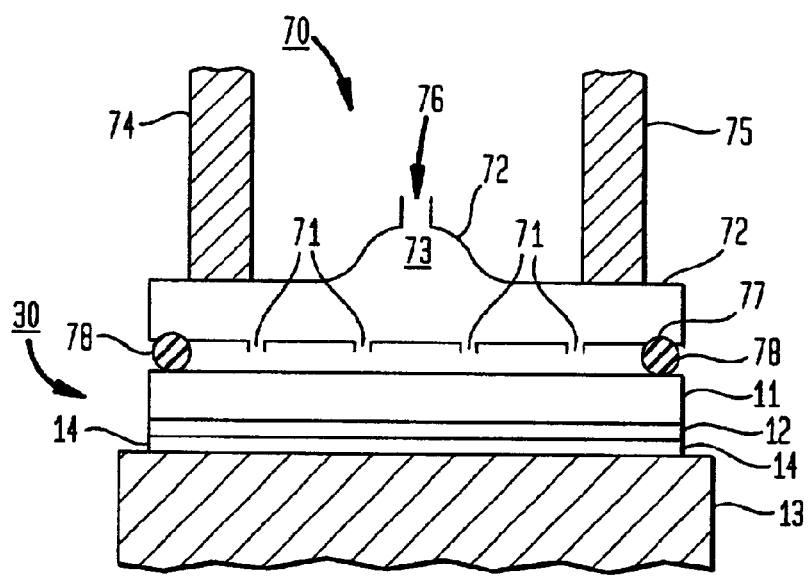
FIG. 5 shows alternative apparatus for practicing the method of FIG. 1.

FIG. 5 illustrates alternative pressing apparatus 70 where the assembly 30 is pressed together by streams of pressurized fluid. Here the assembly is disposed adjacent openings 71 in a hollow pressure cap 72 and the layers are pressed together by jets of pressurized fluid escaping through the openings 71. The cap 72 (analogous to vessel 31) has an internal chamber 73 for pressurized fluid. The regions between the layers are effectively sealed from the pressure vessel by the upper surface.

In operation, the assembly 30 is placed on a substrate holder 79. The cap 72 can be held in fixed position above the assembly 30, as by bars 74, 75. High pressure fluid, preferably gas, is pumped into chamber 73 through an inlet 76. The high pressure fluid within the chamber produces a fluid jet from each opening 71. These jets uniformly press the layers together.

Advantageously, the cap 72 can include a groove 77 along a perimeter of the face adjacent the assembly 30. The groove 77 can hold an O-ring 78 between the cap 72 and the assembly. The O-ring decreases fluid outflow between the cap 72 and the assembly 30, increasing the molding pressure and making it more uniform.

It is understood that the above-described embodiments are illustrative of only a few of the many possible specific embodiments, which can represent applications of the invention. Numerous and varied other arrangements can be made by those skilled in the art without departing from the spirit and scope of the invention.

It is understood that the above-described embodiments are illustrative of only a few of the many possible specific embodiments, which can represent applications of the inven-

What is claimed is:

1. A method of bonding a plurality of layers comprising the steps of:
   providing the layers;
   stacking the layers together into an assembly to be bonded;
   pressing the layers together by direct fluid pressure; and
   bonding the layers of the assembly together;
   wherein the layers are pressed together by streams of pressurized fluid.

2. The method of claim 1 wherein the streams of pressurized fluid comprise a plurality of jets of pressurized fluid.

3. A method of bonding a plurality of layers comprising the steps of:
   providing the layers;
   stacking the layers together into an assembly to be bonded;
   sealing the interface periphery between successive layers around the area to be bonded;
   pressing the layers together by direct fluid pressure and without use of a mechanical pressing operation; and
   bonding the layers of the assembly together.

4. The method of claim 3 wherein the layers include previously formed patterns and the layers are stacked together with the patterns aligned in registration.

5. The method of claim 3 wherein the sealing is effected by providing a ring of fluid impermeable material around the area to be bonded.

6. The method of claim 5 further comprising clamping the assembly peripherally around the area to be bonded.

7. The method of claim 3 wherein the layers are pressed together by disposing the assembly in a pressure vessel and introducing pressurized fluid into the vessel.

8. The method of claim 3 wherein the pressurized fluid is heated.

9. The method of claim 3 wherein the bonding is at least partially effected by heating the pressed layers of the assembly.

10. The method of claim 3 wherein the bonding is at least partially effected by the application of UV radiation to a radiation curable adhesive.

11. The method of claim 3 wherein the interface is sealed by disposing the assembly within a sealed covering of flexible, fluid-impermeable membrane.

12. The method of claim 3 wherein the interface is sealed by clamping the periphery of assembly with a peripheral sealing clamp.

13. A method of bonding a plurality of layers comprising the steps of:
    providing the layers
    stacking the layers together into an assembly to be bonded;
    sealing the interface between successive layers;
    pressing the layers together by direct fluid pressure; and
    bonding the layers of the assembly together;
    wherein the periphery of the assembly is clamped by a peripheral sealing clamp comprising a hollow elastic torroid.

14. The method of claim 12 wherein the periphery is clamped by pressure from a peripheral tube.

15. The method of claim 3 wherein the interface is sealed by disposing an O-ring between successive layers and applying pressure between the successive layers.

16. The method of claim 3 wherein interface is sealed by disposing the assembly between a pair of flexible fluid-membranes and pressing the membranes together around the periphery of the assembly.

17. The method of claim 16 wherein the membranes are pressed together between a pair of cylinders.

18. The method of claim 16 wherein the membranes are pressed together between a cylinder and a planar surface.

19. A method of bonding a plurality of layers comprising the steps of:
    providing the layers;
    stacking the layers together into an assembly to be bonded;
    sealing the interface between successive layers;
    pressing the layers together by direct fluid pressure; and
    bonding the layers of the assembly together;
    wherein the layers are pressed together by streams of pressurized fluid.

20. The method of claim 19 wherein the streams of pressurized fluid comprise a plurality of jets of pressurized fluid.

21. A method of bonding a plurality of layers comprising the steps of:
    providing the layers;
    stacking the layers together by streams of pressurized fluid; and
    bonding the layers of the assembly together.

22. The method of claim 21 wherein the streams of pressurized fluid comprise a plurality of jets of pressurized fluid.

23. The method of claim 21 wherein the bonding is at least partially effected by heating the pressed layers of the assembly.

24. The method of claim 21 wherein the bonding is at least partially effected by applying an electrical field between layers of the assembly.

25. The method of claim 21 wherein the bonding is at least partially effected by applying an electrical current between the layers of the assembly.

26. A method of bonding a plurality of layers comprising steps of:
    providing the layers;
    stacking the layers together into an assembly to be bonded;
    sealing the interface between successive layers;
    pressing the layers together by streams of pressurized fluid; and
    bonding the layers of the assembly together.

27. The method of claim 26 wherein the streams of pressurized fluid comprise a plurality of jets of pressurized fluid.

28. A method of bonding a plurality of layers comprising the steps of:
    providing the layers;
    stacking the layers together into an assembly to be bonded;
    sealing the interface between successive layers, wherein the interface is sealed by clamping the periphery of assembly with a hollow elastic torrid;
    pressing the layers together by direct fluid pressure; and
    bonding the layers of the assembly together.

* * * * *